United States Patent
Fujioka (10) Patent No.: US 6,373,764 B2
(45) Date of Patent: Apr. 16, 2002

(54) SEMICONDUCTOR MEMORY DEVICE ALLOWING STATIC-CHARGE TOLERANCE TEST BETWEEN BIT LINES

(75) Inventor: Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/790,573

(22) Filed: Feb. 23, 2001

(30) Foreign Application Priority Data

Feb. 24, 2000 (JP) ............................................ 12-047803

(51) Int. Cl.$^7$ ................................................ G11C 7/00
(52) U.S. Cl. ...................................... 365/205; 365/201
(58) Field of Search ................................ 365/205, 201, 365/189.06, 207

(56) References Cited

U.S. PATENT DOCUMENTS 6,262,928 B1 * 7/2001 Kim et al. .................. 365/201

* cited by examiner

Primary Examiner—Michael S. Lebentritt
Assistant Examiner—Anh Phung
(74) Attorney, Agent, or Firm—Arent Fox Kintner Plotkin & Kahn, PLLC

(57) ABSTRACT

A semiconductor memory device includes bit lines which transfer data of memory cells, a plurality of first sense amplifier circuits connected to odd-number lines of the bit lines, a plurality of second sense amplifier circuits connected to even-number lines of the bit lines, and a clamp-voltage generation circuit which supplies a first clamp voltage to the first sense amplifier circuits, and supplies a second clamp voltage to the second sense amplifier circuits, whereby during test operation, the odd-number lines are clamped to the first clamp voltage, and the even-number lines are clamped to the second clamp voltage.

10 Claims, 8 Drawing Sheets

FIG.4A WLBIZ

FIG.4B CLK

FIG.4C CODE

FIG.5

| TEST MODE | FLAG | 1st BIT | 2ndBIT | WLBIZ |
|---|---|---|---|---|
| NORMAL OPERATION | DON'T CARE | DON'T CARE | DON'T CARE | L |
| TEST/WAITE*1 | L | L | L | H |
| VPR0/1=L | H | L | L | H |
| VPR0=H/VPR1=L | H | L | H | H |
| VPR0=L/VPR1=H | H | H | L | H |

*1: TEST OPERATION OR STANDBY STATUS
WAITING FOR CODE INPUT

SEMICONDUCTOR MEMORY DEVICE ALLOWING STATIC-CHARGE TOLERANCE TEST BETWEEN BIT LINES

BACKGROUND OF THE INVENTION

1. Field of the Invention

The present invention generally relates to semiconductor memory devices, and particularly relates to a semiconductor memory device that allows a proper check while it is on a wafer.

2. Description of the Related Art

WLBI (wafer level burn-in) is a process of stabilizing characteristics of semiconductor devices by exposing them to a high temperature and high voltage environment for a predetermined time period.

In the WLBI of DRAMs, a high voltage is applied to predetermined circuitry inside the memory chip, and chips are rejected if they have cell transistors with insufficient static charge tolerance. In detail, a mode flag signal indicative of the WLBI test is input to the chip, thereby entering in the WLBI test mode. In the WLBI test mode, bit lines are fixed to the ground level (i.e., the voltage level of the ground-side power supply voltage), and word lines are all selected and placed in the activated state. With the bit lines clamped to the low voltage level, a high gate voltage is applied to all the cell transistors in this manner to place them under stress.

If the static charge tolerance of cell transistors is insufficient, they will be destroyed during the test. Chips having broken transistors can be easily identified by checking the chips' electric power consumption, thereby rejecting the chips with destroyed transistors.

The WLBI test as described above can reject chips only if these chips have insufficient static charge tolerance. In reality, insufficient static charge tolerance surfaces as a problem even between adjacent bit lines or adjacent storage points (i.e., joint points between a memory cell and a cell transistor). It is thus desirable to test such static charge tolerance.

Accordingly, there is a need for a semiconductor memory device that allows testing of various static charge tolerances in the WLBI test.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor memory device according to the present invention includes bit lines which transfer data of memory cells, a plurality of first sense amplifier circuits connected to odd-number lines of the bit lines, a plurality of second sense amplifier circuits connected to even-number lines of the bit lines, and a clamp-voltage generation circuit which supplies a first clamp voltage to the first sense amplifier circuits, and supplies a second clamp voltage to the second sense amplifier circuits, whereby during test operation, the odd-number lines are clamped to the first clamp voltage, and the even-number lines are clamped to the second clamp voltage.

In the semiconductor memory device described above, a clamp-voltage generation circuit is provided to supply the first clamp voltage to the first sense amplifier circuits and to supply the second clamp voltage to the second sense amplifier circuits in the test mode. With this configuration, during test operation, the odd-number bit lines are clamped to the first clamp voltage, and the even-number bit lines are clamped to the second clamp voltage. Accordingly, a voltage difference is generated between bit lines to apply a stress, thereby making it possible to test static-charge tolerance between the bit lines.

Further, selection of all word lines, if so selected, makes it possible to test static-charge tolerance between storage points.

Moreover, the first and second clamp voltages may be set to voltages varying depending on a code signal supplied from an exterior of the semiconductor memory device. This makes it possible to clamp all the bit lines to LOW, thereby conducting a conventional static-charge tolerance test.

DESCRIPTION OF THE PREFERRED EMBODIMENTS

In the following, embodiments of the present invention will be described with reference to the accompanying drawings.

Figure 1:
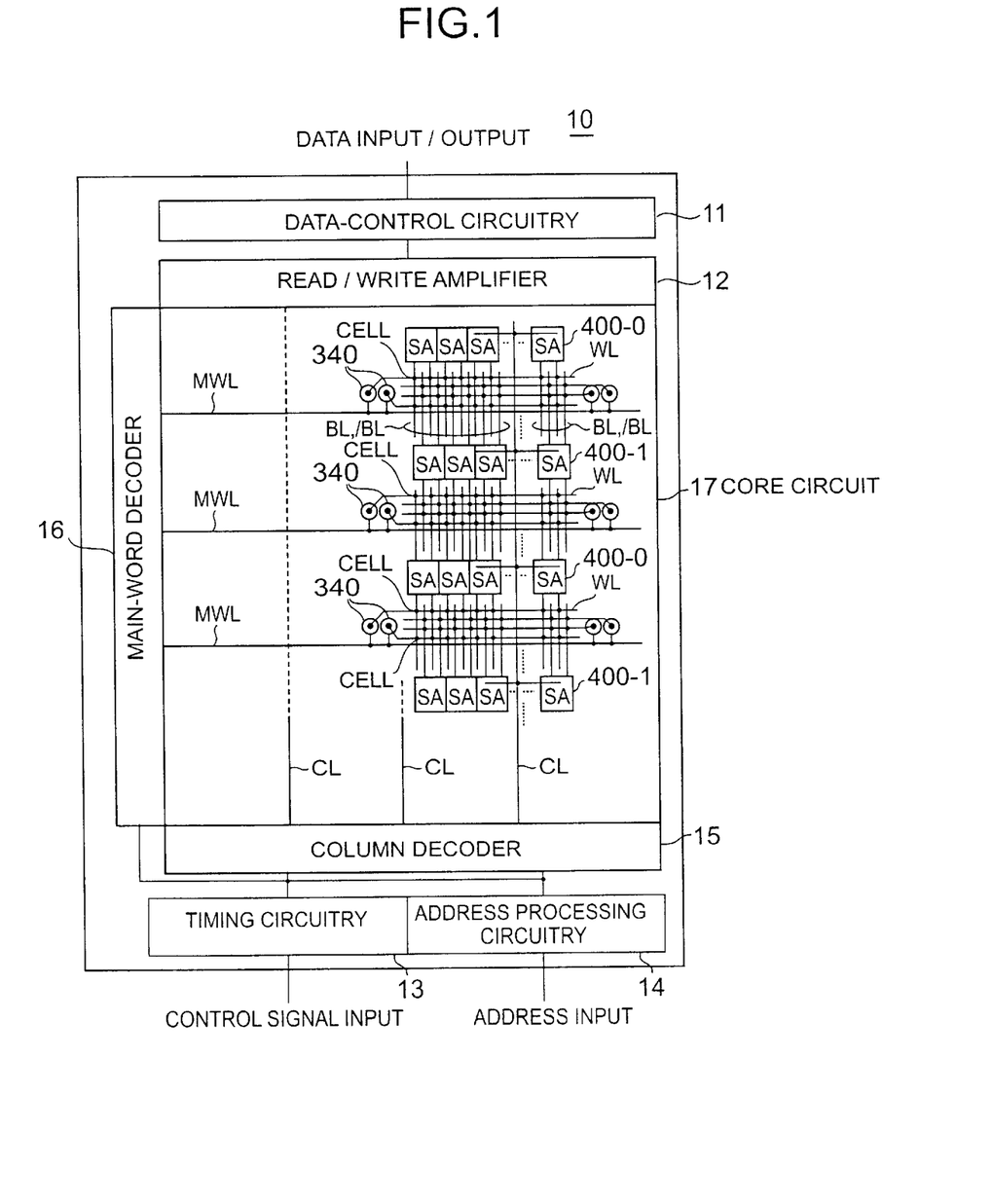
FIG. 1 is a drawing showing a semiconductor memory device to which the present invention is applied.

FIG. 1 is a drawing showing a semiconductor memory device to which the present invention is applied.

A semiconductor memory device 10 of FIG. 1 includes a data-control circuitry 11, a read/write amplifier 12, a timing circuitry 13, an address processing circuitry 14, a column decoder 15, a main-word decoder 16, and a core circuit 17.

The core circuit 17 is provided with a plurality of memory cells CELL arranged in a matrix form, and includes circuitry and signal lines for address selection, data amplification, and so on in order to read/write 1-bit data from/in each cell. The core circuit 17 shown illustratively in FIG. 1 includes a plurality of sense amplifier units 400-0 and 400-1, a plurality of sub-word decoder 340, a plurality of word lines WL, a plurality of main word lines MWL, and a plurality of column lines CL.

The data-control circuitry 11 includes circuitry such as data buffers. The data-control circuitry 11 supplies data to the read/write amplifier 12 at an appropriate timing as the data is provided from the exterior of the device, and supplies data to the exterior of the device at an appropriate timing as the data is read from the core circuit 17 and the read/write amplifier 12. The read/write amplifier 12 amplifies write data, followed by supplying the data to the core circuit 17, and, also, amplifies data supplied form the core circuit 17.

The timing circuitry 13 is comprised of control-signal buffers, a command decoder, and so on. The timing circuitry 13 receives control signals and a clock signal from the exterior of the device, and interprets commands represented by the control signals, thereby controlling operation and operation timings of each unit provided in the semiconductor memory device 10.

The address processing circuitry 14 includes address buffers, an address pre-decoder, and so on. The address processing circuitry 14 receives address signals from the exterior of the device, and supplies them to the column decoder 15 and the main-word decoder 16 at appropriate timings.

The column decoder 15 decodes a column address supplied from the address processing circuitry 14, and activates a column line CL corresponding to the specified column address. The main-word decoder 16 decodes a row address supplied from the address processing circuitry 14, and activates a main-word line MWL corresponding to the specified row address. In the configuration of FIG. 1, a hierarchical word decode scheme is employed. In this configuration, a plurality of word lines correspond to the main-word line MWL selected by the main-word decoder, and one of these word lines WL is selectively activated by a sub-word decoder 340.

In the case of read operation, data is read from cells CELL connected to the activated word line WL, and the sense amplifier unit 400-0 or 400-1 amplifies the read data. The amplified data is then read from a sense amplifier unit corresponding to the activated column line CL, and is supplied to the read/write amplifier 12. In the case of write operation, which is performed in a reversed manner to the read operation, a sense amplifier unit selected by the activated column line CL receives data from the read/write amplifier 12, and the data of the sense amplifier unit is stored in a cell CELL connected to the activated word line WL.

The semiconductor memory device of FIG. 1 is a twin-storage-type memory, in which a pair of bit lines BL and /BL connected to a sense amplifier unit each have a memory cell CELL connected thereto. One of the pair of memory cells stores given data, and the other stores the inverted data.

Figure 2:
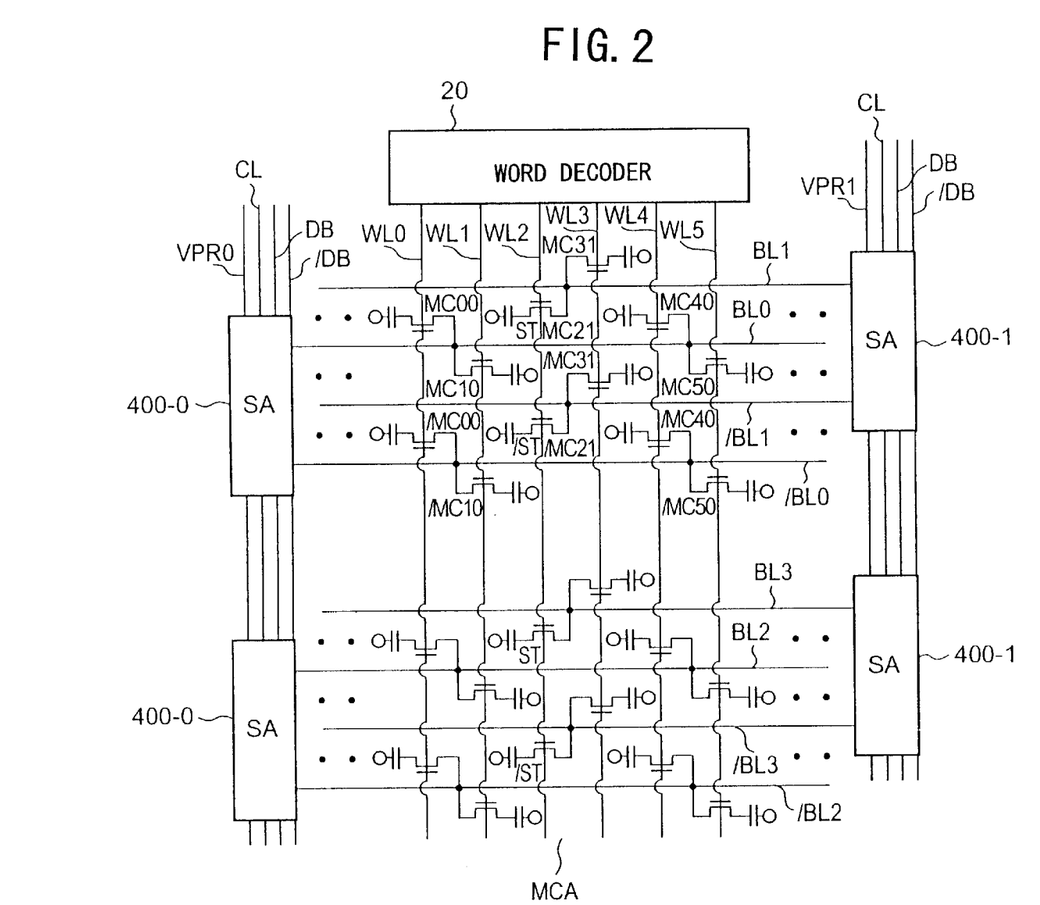
FIG. 2 is a circuit diagram showing a main portion of a core circuit of a twin-storage-type memory.

FIG. 2 is a circuit diagram showing a main portion of the core circuit 17 of the twin-storage-type memory.

The configuration of FIG. 2 includes a word decoder 20, the sense amplifier units 400-0 and 400-1, bit lines BLn and / BLn (n=1, 2, 3, . . . ), word lines WL0 through WL5, and memory cell units MCxy and /MCxy each comprised of a transistor and a capacitor (x and y indicate a row position and a column position, respectively). Here, the word decoder 20 collectively represents one set of the sub-word decoders 340 shown in FIG. 1. Further, "/" preceding symbols represents logic inversion of the same symbols having no "/".

As can be seen from FIG. 2, when the word line WL0 is activated, data of the memory cell unit MC00 appears on the bit line BL0, and data of the memory cell unit /MC00 appears on the bit line /BL0. When the memory cell unit MC00 has HIGH data stored therein, the memory cell unit /MC00 has LOW data stored therein. In this case, the potential of the bit line BL0 shifts toward the HIGH potential, and the potential of the bit line /BL0 shifts toward the LOW potential. A resulting potential difference is amplified by the sense amplifier unit 400-0 connected to the bit lines BL0 and /BL0. The data amplified by the sense amplifier unit 400-0 is supplied to a data bus DB and /DB when a column line CL connected to this sense amplifier unit is activated.

In the twin-storage-type memory, stable data read operation is attainable compared to a conventional DRAM structure in which only one of the pair of bit lines has a memory cell connected thereto. Because of this, a refresh cycle can be elongated, for example, as an advantage.

A twin-storage-type memory to which the present invention is applied has a configuration in which adjacent bit lines are connected to different sense amplifier units. Namely, for example, the bit line BL1 shown on the top in FIG. 2 is connected to the sense amplifier unit 400-1, and the next bit line BL0 is connected to the sense amplifier unit 400-0, followed by the next bit line /BL1 connected to the sense amplifier unit 400-1. In this manner, the sense amplifier unit 400-0 has even-number bit lines connected thereto, and the sense amplifier unit 400-1 has odd-number bit lines connected thereto.

Of given two adjacent bit lines, one is connected to the sense amplifier unit 400-0, and the other is connected to the sense amplifier unit 400-1. Accordingly, a precharge voltage (i.e., bit-line clamp voltage) VPR0 supplied to the sense amplifier unit 400-0 and a precharge voltage (bit-line clamp voltage) VPR1 supplied to the sense amplifier unit 400-1 may be set to HIGH and LOW, respectively, or vise versa, thereby setting two adjacent bit liens to HIGH and LOW.

In the present invention, the bit-line clamp voltages VPR0 and VPR1 are set to different voltages in this manner, so that static-charge tolerance tests can be conducted between bit lines during the WLBI test mode.

In the following, a configuration that supplies different bit-line clamp voltages will be described.

Figure 3:
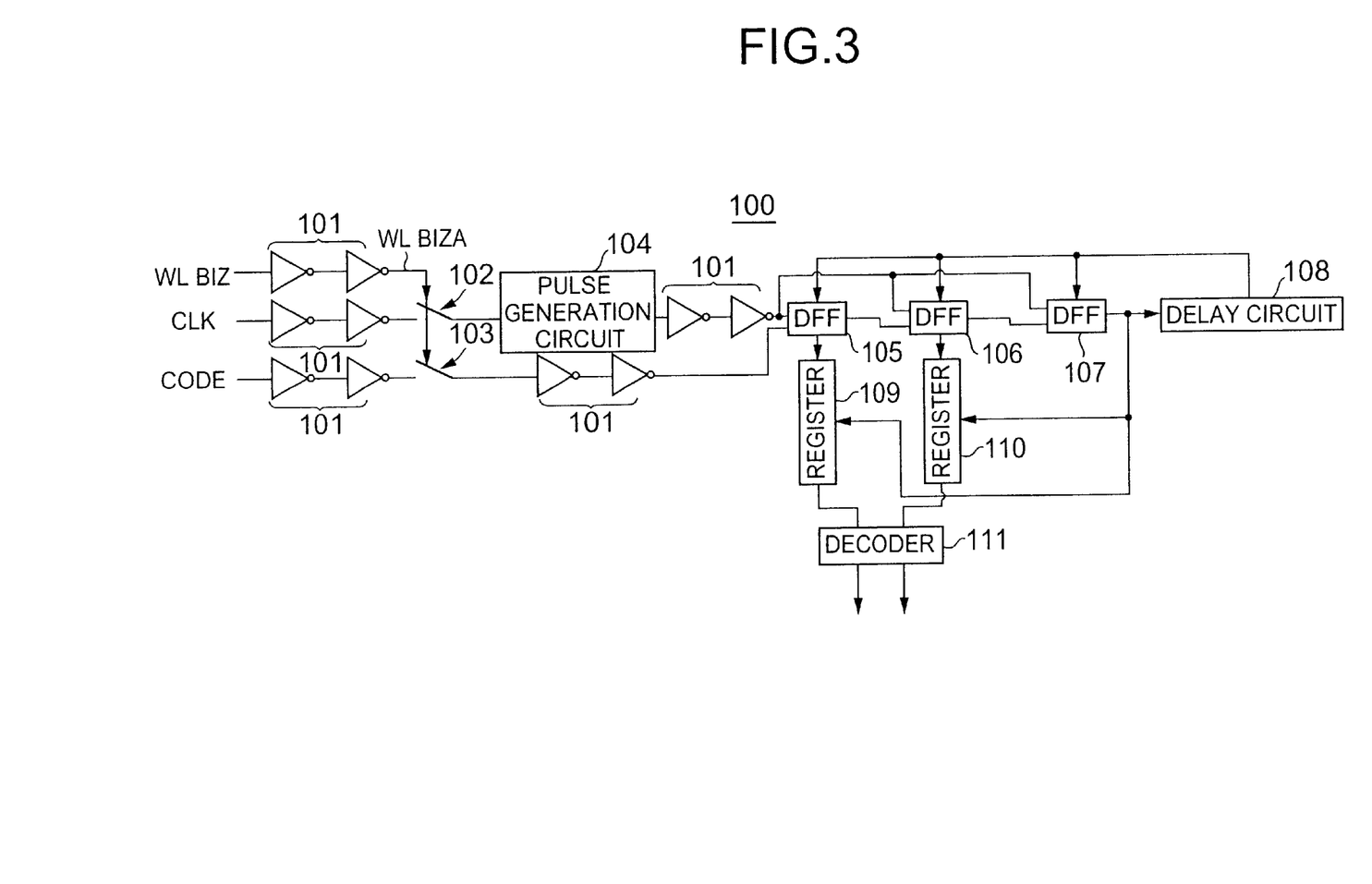
FIG. 3 is a block diagram showing an entry unit that receives a mode flag signal.

FIG. 3 is a block diagram showing an entry unit that receives a mode flag signal. The entry unit is part of the command-control related circuitry of the timing circuitry 13 shown in FIG. 1.

When the WLBI test mode needs to be activated, a mode-flag signal WLBIZ (HIGH) is input to the entry unit from the exterior of the semiconductor memory device. In the specification of the present application, a signal name that ends with "Z" or "z" represents a positive logic signal, and a signal name that ends with "X" or "x" represents a negative logic signal.

An entry unit 100 of FIG. 3 includes a plurality of inverters 101 serving as buffers, switches 102 and 103, a pulse generation circuit 104, DFF (delay flip-flops) 105 through 107, a delay circuit 108, a register 109, a register 110, and a decoder 111.

The entry unit 100 receives the mode-flag signal WLBIZ, a clock signal CLK, and a code signal CODE from the exterior of the memory chip. The mode-flag signal WLBIZ is supplied to the switches 102 and 103 as a mode-flag signal WLBIZA after passing through a series of inverters 101. The switches 102 and 103 are switched on when the mode-flag signal WLBIZA becomes HIGH. When these switches are on, the clock signal CLK is supplied to the pulse generation circuit 104, and the code signal CODE is supplied to the DFF 105.

The pulse generation circuit 104 generates a pulse signal in response to rising edges of the clock signal. The pulse signal is supplied to the DFF 105 through 106 via a series of inverters 101. Each of the DFF 105 through 107 latches input data in response to the pulse signal input, and outputs the latched data when the pulse signal input returns to LOW. This makes the code signal CODE shift through the DFF 105 through 107 where the code signal CODE is entered one bit by one bit in a serial fashion at each cycle of the clock signal CLK.

The code signal CODE is defined such as to start from "1". When the code signals "1", "X", and "Y" are stored in the DFF 107, 106, and 105, respectively, the output of the DFF 107 that stores "1" therein becomes HIGH. In response to the HIGH output of the DFF 107, the registers 109 and 110 store the data of the DFF 105 and 106, respectively. That is, the register 109 stores "Y" therein, and the register 110 stores "X" therein. The delay circuit 108 delays the HIGH output of the DFF 107, thereby resetting each DFF at a timing at which storing of the data in the registers 109 and 110 is completed.

The data stored in the registers 109 and 110 are decoded by the decoder 111. As a decoding result, the decoder 111 produces signals TVPR0Z and TVPR1Z. The signals TVPR0Z and TVPR1Z are not the same as the bit-line clamp voltages VPR0 and VPR1, but are identical to the bit-line clamp voltages VPR0 and VPR1 in terms of their signal logic levels.

Figure 4A:
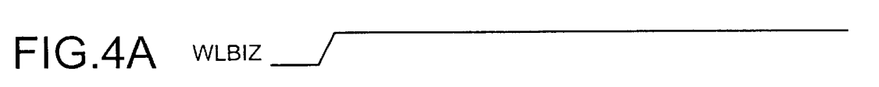
FIGS. 4A through 4C are illustrative drawings for explaining code signal inputs to the entry unit.
Figure 4B:
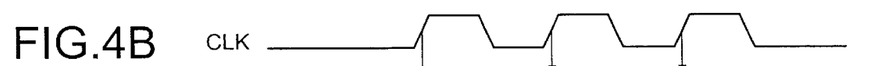
Figure 4C:
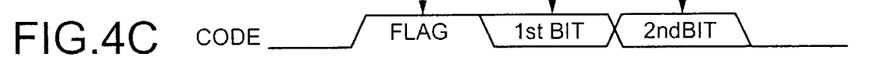

FIGS. 4A through 4C are illustrative drawings for explaining code signal inputs to the entry unit.

As shown in FIG. 4A, the mode-flag signal WLBIZ is set equal to HIGH so as to enter into the WLBI test mode. Thereafter, as shown in FIGS. 4B and 4C, the code signal CODE is entered one bit by one bit in synchronization with the clock signal CLK. The very first bit is a FLAG bit, which is followed by a first bit and a second bit.

Figure 5:
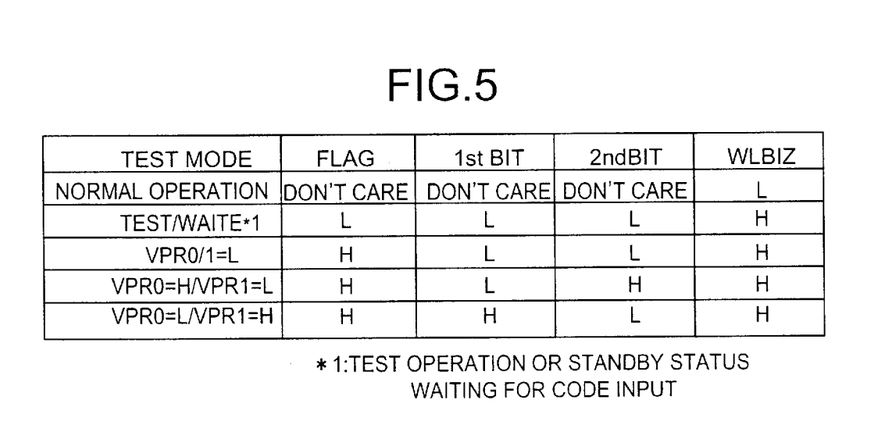
FIG. 5 is a table showing settings of bit-line clamp voltages responsive to the code signal inputs.

FIG. 5 is a table showing settings of the bit-line clamp voltages responsive to the code signal inputs.

As shown in FIG. 5, different combinations of the mode-flag signal WLBIZA and the code signals CODE define different settings of the bit-line clamp voltages.

If the mode-flag signal WLBIZ is LOW, the switches 102 and 103 of the entry unit 100 of FIG. 3 are not switched on. As a result, the WLBI test mode is not selected, so that normal and routine operation will be performed. When the mode-flag signal WLBIZ becomes HIGH, the device enters into the WLBI test mode.

Even in the WLBI test mode, if the FLAG bit, the first bit, and the second bit of the code signal CODE are all LOW, no data is stored in the registers 109 and 110 of the entry unit 100 shown in FIG. 3. This results in a waiting state.

In response to the code signal CODE having the FLAG bit thereof equal to HIGH, bit lines are clamped to certain voltages in accordance with the contents of the code signal CODE.

Namely, when the first and second bits of the code signal CODE are both LOW, the clamp voltages VPR0 and VPR1 become LOW, so that all the bit lines are clamped to the LOW voltage level. When the first bit and the second bit of the code signal CODE are LOW and HIGH, respectively, the clamp voltages VPR0 and VPR1 become HIGH and LOW, respectively. As a result, even-number bit lines are clamped to the HIGH voltage level, and the odd-number bit lines are clamped to the LOW voltage level. Conversely, when the first bit and the second bit of the code signal CODE are HIGH and LOW, respectively, the clamp voltages VPR0 and VPR1 become LOW and HIGH, respectively. As a result, even-number bit lines are clamped to the LOW voltage level, and the odd-number bit lines are clamped to the HIGH voltage level.

Figure 6:
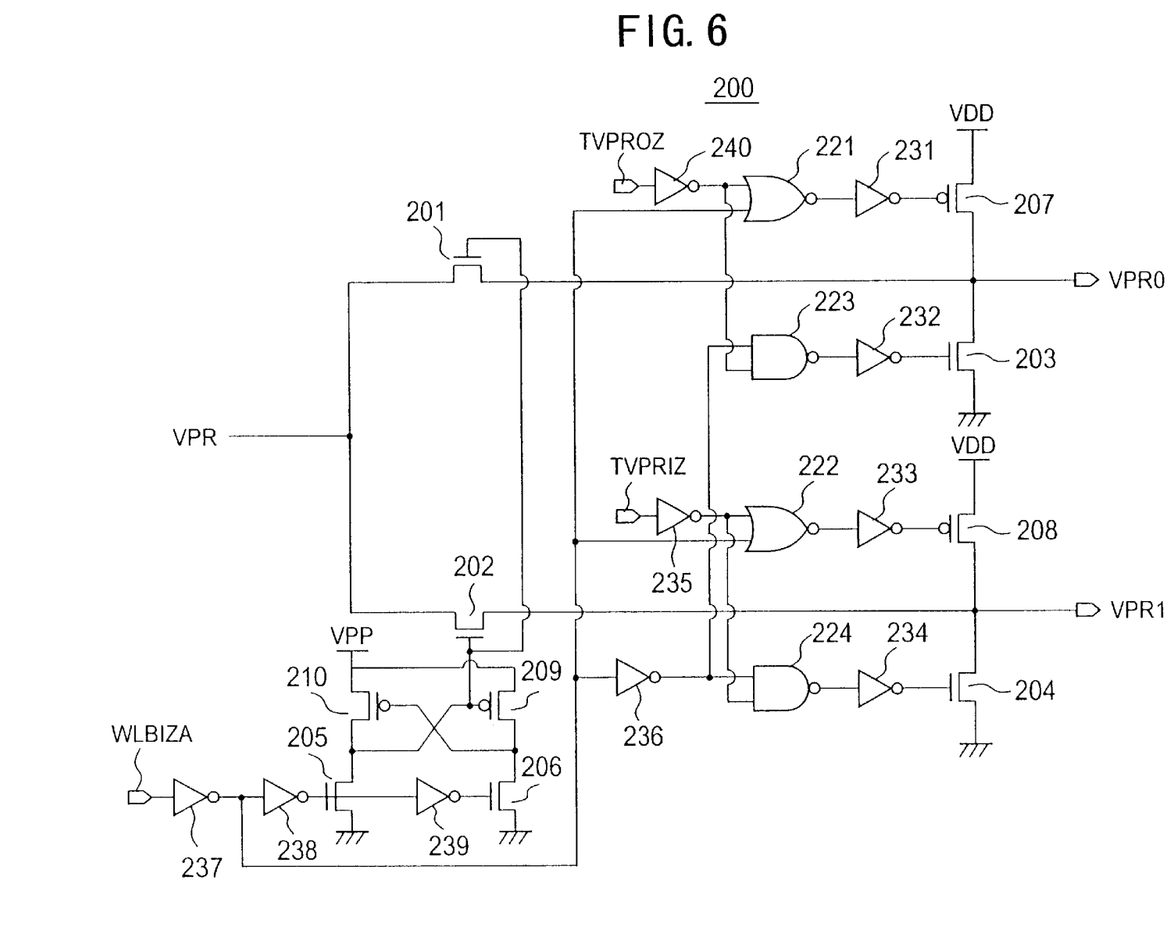
FIG. 6 is a circuit diagram showing a circuit generating bit-line clamp voltages.

FIG. 6 is a circuit diagram showing a circuit generating bit-line clamp voltages.

A bit-line clamp voltage generation unit 200 of FIG. 6 receives the signals WLBIZA, TVPR0Z, and TVPR1Z, and generates bit-line clamp voltages VPR0 and VPR1.

The bit-line clamp voltage generation unit 200 includes NMOS transistors 201 through 206, PMOS transistors 207 through 210, NOR circuits 221 and 222, NAND circuits 223 and 224, and inverters 231 through 240. The NMOS transistors 205 and 206 and PMOS transistors 209 and 210 together make up a level shifter circuit.

At the circuit of FIG. 6, the mode-flag signal WLBIZA is LOW during the normal operation, so that NMOS transistors 201 and 202 become conductive. In this case, an incoming precharge voltage VPR is output through the NMOS transistors 201 and 202 without any change. During the normal operation, therefore, bit lines are precharged to the predetermined precharge voltage VPR.

As this happens, the NOR circuit 221 receives a HIGH input from the inverter 237 so as to produce a LOW output, thereby making the PMOS transistor 207 nonconductive. By the same token, the PMOS transistor 208 is also nonconductive. Further, the NAND circuit 223 receives a LOW signal from the inverter 236, so that the output of the NAND circuit 223 becomes HIGH, resulting in the NMOS transistor 203 being nonconductive. By the same token, the NMOS transistor 204 is also nonconductive. It is thus confirmed that the predetermined precharge voltage VPR is output without any interference during the normal operation.

In the WLBI test mode, the mode-flag signal WLBIZA is HIGH, so that NMOS transistors 201 and 202 become nonconductive. The bit-line clamp voltages VPR0 and VPR1 are thus determined by the signals TVPR0 and TVPR1 supplied from the entry unit 100.

Analysis will be given with respect to the signal TVPR0Z. The NOR circuit 221 receives at one input thereof a LOW signal supplied from the inverter 237, so that the output of the NOR circuit 221 will be an inverse of the input signal to the other input thereof. In this case, therefore, the output of the NOR circuit 221 is equal to the signal TVPR0Z. The NAND circuit 223 receives at one input thereof a HIGH signal supplied from the inverter 236, so that the output of the NAND circuit 223 will be an inverse of the signal input to the other input thereof. Namely, the output of the NAND circuit 223 is equal to the signal TVPR0Z. When the signal TVPR0Z is HIGH, therefore, the PMOS transistor 207 becomes conductive, and the NMOS transistor 203 becomes nonconductive. As a result, the bit-line clamp voltage VPR0 is HIGH. When the signal TVPR0Z is LOW, the PMOS transistor 207 becomes nonconductive, and the NMOS transistor 203 becomes conductive. In this case, therefore, the bit-line clamp voltage VPR0 is LOW.

The same applies in the case of the signal TVPR1Z. Namely, when the signal TVPR1Z is HIGH, the bit-line clamp voltage VPR1 becomes HIGH. When the signal TVPR1Z is LOW, the bit-line clamp voltage VPR1 becomes LOW.

In this manner, during the WLBI test mode, the bit-line clamp voltages VPR0 and VPR1 are generated according to the signals TVPR0 and TVPR1 supplied from the entry unit 100.

Figure 7:
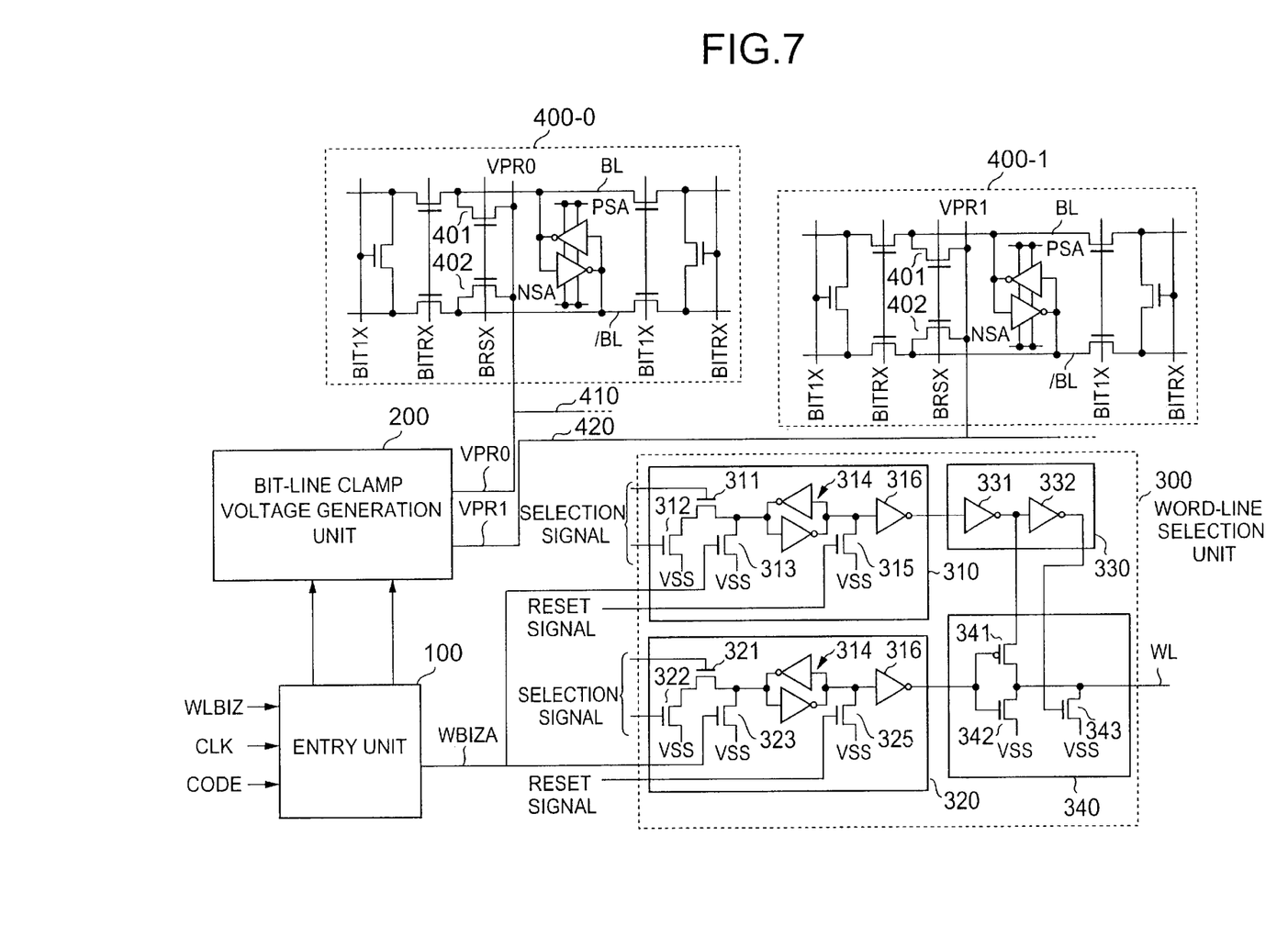
FIG. 7 is a circuit diagram showing a control mechanism for clamping bit lines and selecting all word lines.

FIG. 7 is a circuit diagram showing a control mechanism for clamping bit lines and selecting all word lines.

The configuration of FIG. 7 includes the entry unit 100, the bit-line clamp voltage generation unit 200, a word-line selection unit 300, and the sense amplifier units 400-0 and 400-1. The entry unit 100 is shown in FIG. 3, and the bit-line clamp voltage generation unit 200 is shown in FIG. 6.

The word-line selection unit 300 includes a main quarter decoder 310, a main word decoder 320, a sub quarter decoder 330, and a sub-word decoder 340. The main quarter decoder 310 includes NMOS transistors 311 through 313, a latch 314 comprised of two inverters, an NMOS transistor 315, and an inverter 316. The main word decoder 320 includes NMOS transistors 321 through 323, a latch 324 comprised of two inverters, an NMOS transistor 325, and an inverter 326. The sub quarter decoder 330 includes inverters 331 and 332. The sub-word decoder 340 includes a PMOS transistor 341 and NMOS transistors 342 and 343.

In the main quarter decoder 310, the NMOS transistors 311 and 312 receive selection signals at the gates thereof. When the selection signals are all HIGH, the main quarter decoder 310 shown in FIG. 7 is selected among a plurality of main quarter decoders of the same type. Likewise, in the main word decoder 320, the NMOS transistors 321 and 322 receive selection signals at the gates thereof. When the selection signals are all HIGH, the main word decoder 320 shown in FIG. 7 is selected among a plurality of main word decoders of the same kind. Upon selection of the main quarter decoder 310 and the main word decoder 320, each of these decoders produces a LOW output, so that the word line WL of the sub-word decoder 340 is activated to HIGH.

In the WLBI test mode, i.e., when the mode-flag signal WLBIZA output from the entry unit 100 is HIGH, the NMOS transistor 313 of the main quarter decoder 310 and the NMOS transistor 323 of the main word decoder 320 become conductive. As a result, the word line WL is activated to HIGH regardless of whether the main quarter decoder 310 and the main word decoder 320 are selected. Namely, all word lines are activated without exception.

The clamp voltages VPR0 and VPR1 output from the bit-line clamp voltage generation unit 200 are supplied to the sense amplifier units 400-0 and 400-1 via signal lines 410 and 420, respectively. In the sense amplifier unit 400-0, when a signal brsx for clamping (precharging) bit lines BL and /BL becomes HIGH, the transistors 401 and 402 are made conductive, resulting in the bit lines BL and /BL being clamped to the clamp voltage VPR0. In the sense amplifier unit 400-1, likewise, bit lines BL and /BL are clamped to the clamp voltage VPR1.

Although not shown in FIG. 7, the clamp voltage VPR0 is supplied to a plurality of sense amplifier units of this type, which are connected to pairs of even-number bit lines in the memory core circuit, and the clamp voltage VPR1 is supplied to a plurality of sense amplifier units of this time, which are connected to pairs of odd-number bit lines in the memory core circuit.

Figure 8:
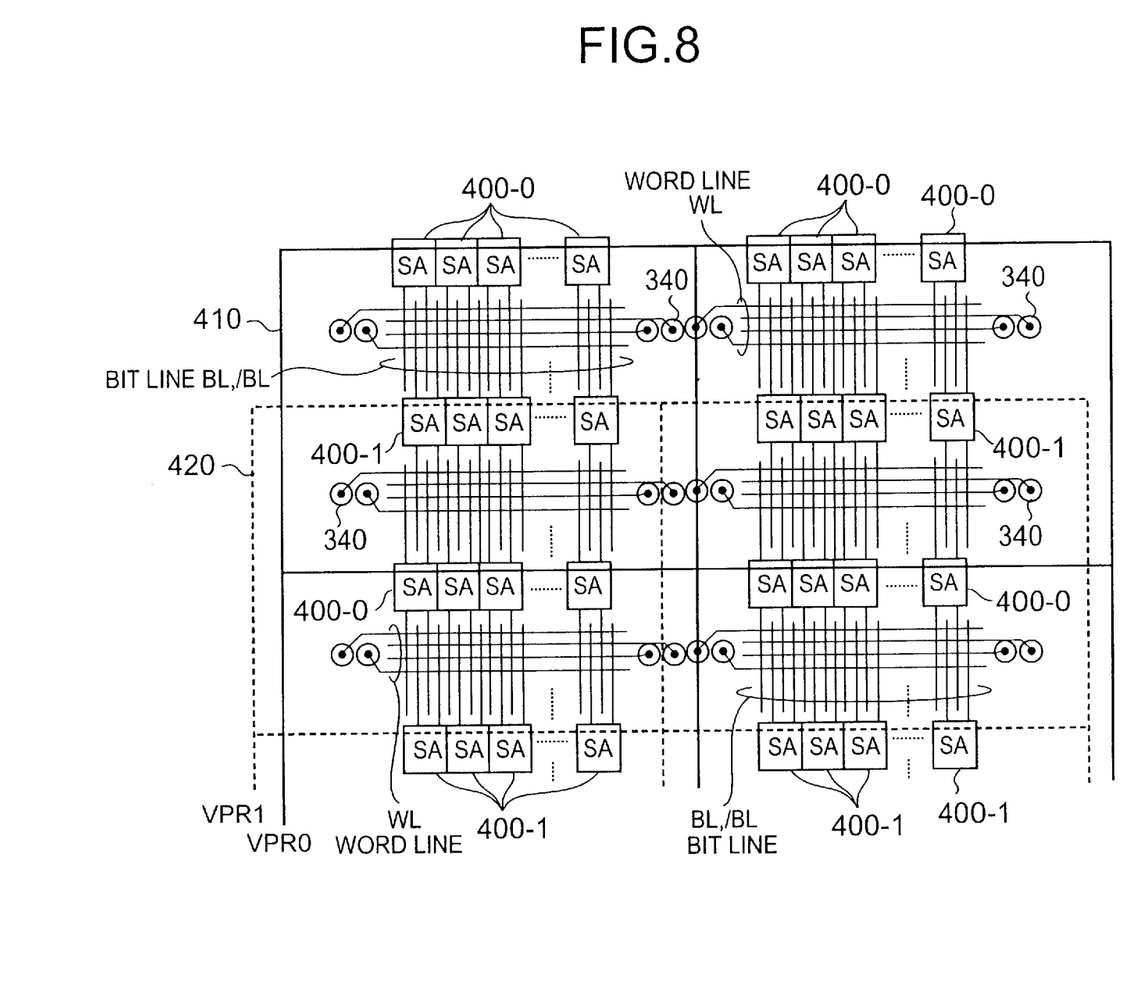
FIG. 8 is an illustrative drawing showing a layout of signal lines that supply clamp voltages to sense amplifier units.

FIG. 8 is an illustrative drawing showing a layout of the signal lines 410 and 420 that supply the clamp voltages to the sense amplifier units.

As shown in FIG. 8, each line of the sense amplifier units 400-0 and each line of the sense amplifier units 400-1 are arranged alternately. The sense amplifier units 400-0 are connected to even-number bit lines, and the sense amplifier units 400-1 are connected to odd-number bit lines. Here, it is not important which one is connected to even-number bit lines and which one is connected to odd-number bit lines. What is important is that they are connected to bit lines alternately.

The signal lines 410 for supplying the clamp voltage VPR0 is connected to the sense amplifier units 400-0, and the signal lines 420 for supplying the clamp voltage VPR1 is connected to the sense amplifier units 400-1.

Accordingly, even-number lines of the bit lines BL and /BL are clamped to the clamp voltage VPR0, and odd-number lines thereof are clamped to the clamp voltage VPR1. Namely, they are clamped to the clamp voltages VPR0 and VPR1 alternately in terms of special arrangement.

In the WLBI test of the present invention, as previously described, different combinations of the clamp voltages VPR0 and VPR1 can be selected. That is, there are three different combinations, the first one with the clamp voltages VPR0 and VPR1 being both LOW, the second one with the clamp voltage VPR0 being HIGH and the clamp voltage VPR1 being LOW, and the third one with the clamp voltage VPR0 being LOW and the clamp voltage VPR1 being HIGH. This makes it possible to apply a stress between adjacent bit lines, thereby testing static-charge tolerance between the bit lines. It is also possible to conduct the conventional WLBI test that sets all the bit lines to LOW.

Figure 9:
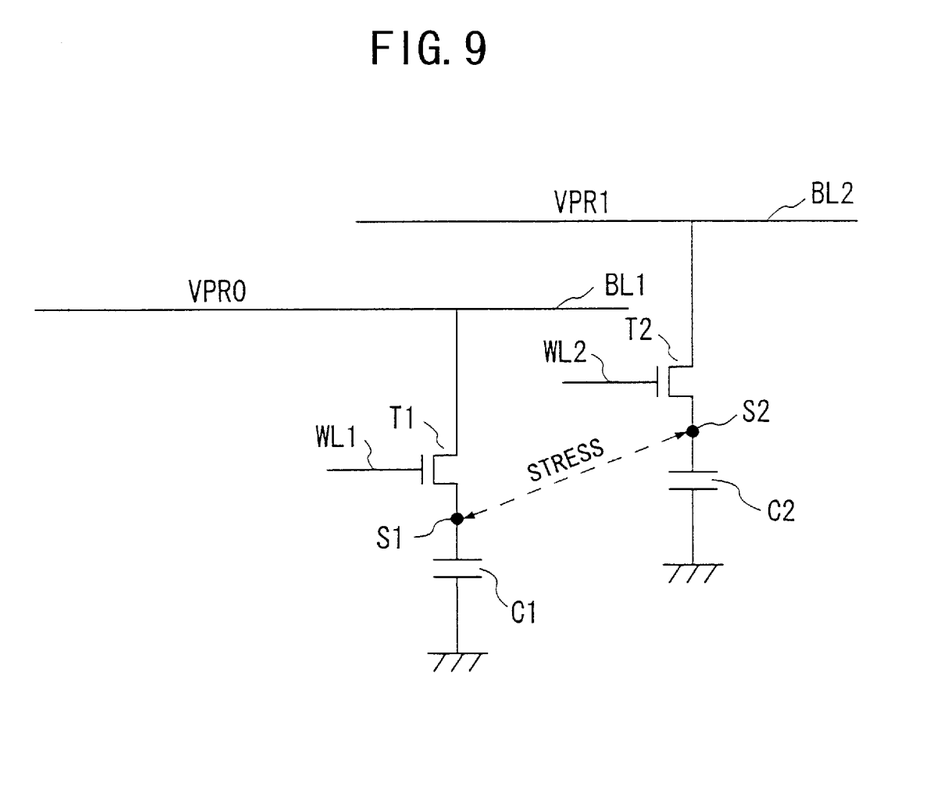
FIG. 9 is an illustrative drawing for explaining a stress applied between storage points.

FIG. 9 is an illustrative drawing for explaining a stress applied between storage points.

Bit lines BL1 and BL2 represent adjacent bit lines, and are clamped to the clamp voltages VPR0 and VPR1, respectively, during the WLBI test. Since the word lines WL1 and WL2 are both selected during the test, cell transistors T1 and T2 become conductive. Storage points S1 and S2 are joint points between the cell transistors T1 and T2 and cells C1 and C2, respectively. Since the cell transistors T1 and T2 are both conductive, the storage point S1 has the clamp voltage VPR0 applied thereto, and the storage point S2 has the clamp voltage VPR1 applied thereto.

As a result, a stress is applied between the adjacent storage points corresponding to the adjacent bit lines. This makes it possible to conduct a static-charge tolerance test between storage points as well as between bit lines.

Further, the present invention is not limited to these embodiments, but various variations and modifications may be made without departing from the scope of the present invention.

The present application is based on Japanese priority application No. 2000-047803 filed on Feb. 24, 2000, with the Japanese Patent Office, the entire contents of which are hereby incorporated by reference.

What is claimed is:

1. A semiconductor memory device, comprising:
   bit lines which transfer data of memory cells;
   a plurality of first sense amplifier circuits connected to odd-number lines of said bit lines;
   a plurality of second sense amplifier circuits connected to even-number lines of said bit lines; and
   a clamp-voltage generation circuit which supplies a first clamp voltage to said first sense amplifier circuits, and supplies a second clamp voltage to said second sense amplifier circuits, whereby during test operation, the odd-number lines are clamped to the first clamp voltage, and the even-number lines are clamped to the second clamp voltage.

2. The semiconductor memory device as claimed in claim 1, further comprising a mode-detection unit which detects a type of a test mode based on a code signal supplied from an exterior of said semiconductor memory device, wherein said clamp-voltage generation circuit generates the first and second clamp voltages according to the type of a test mode detected by said mode-detection unit.

3. The semiconductor memory device as claimed in claim 1, wherein lines of said first sense amplifier circuits alternate with lines of said second sense amplifier circuits in terms of arrangement thereof in a memory core circuit.

4. The semiconductor memory device as claimed in claim 1, further comprising a word decoder which selects all word lines during the test operation, thereby applying the first clamp voltage to a given storage point and applying the second clamp voltage to a storage point adjacent to the given storage point.

5. The semiconductor memory device as claimed in claim 1, further comprising a word decoder which decodes a row address to select a corresponding word line during normal operation, and selects all word lines during the test operation.

6. The semiconductor memory device as claimed in claim 1, wherein said clamp-voltage generation circuit supplies a common precharge voltage to both said first sense amplifier circuits and said second sense amplifier circuits during normal operation, and generates the first and second clamp voltages in accordance with a test mode during the test operation.

7. The semiconductor memory device as claimed in claim 1, wherein said clamp-voltage generation circuit generates the first and second clamp voltages varying depending on a type of a test mode.

8. The semiconductor memory device as claimed in claim 1, wherein any given sense amplifier circuit of the first and second sense amplifier circuits is connected to two bit lines, which are provided with respective memory cells forming a pair of memory cells each for one-bit data, one of the pair of memory cells storing therein data, and another one of the pair of memory cells storing an inverse of the data.

9. A semiconductor memory device, comprising:

bit lines; and a clamp-voltage generation circuit which generates first and second clamp voltages, wherein during test operation, odd-number lines of said bit lines are clamped to the first clamp voltage, and even-number lines of said bit lines are clamped to the second clamp voltage.

10. The semiconductor memory device as claimed in claim 9, wherein the first clamp voltage differs from the second clamp voltage.

* * * * *